United States Patent
Miyoshi

(10) Patent No.: US 9,354,288 B2
(45) Date of Patent: May 31, 2016

(54) MAGNETIC RESONANCE APPARATUS AND METHOD USING THEREOF

(71) Applicant: GE MEDICAL SYSTEMS GLOBAL TECHNOLOGY COMPANY, LLC, Waukesha, WI (US)

(72) Inventor: Mitsuharu Miyoshi, Tokyo (JP)

(73) Assignee: General Electric Company, Schenectady, NY (US)

(*) Notice: Subject to any disclaimer, the term of this patent is extended or adjusted under 35 U.S.C. 154(b) by 83 days.

(21) Appl. No.: 14/488,726

(22) Filed: Sep. 17, 2014

(65) Prior Publication Data

US 2015/0077110 A1 Mar. 19, 2015

(30) Foreign Application Priority Data

Sep. 18, 2013 (JP) ................................. 2013-193483

(51) Int. Cl.
*G01R 33/56* (2006.01)

(52) U.S. Cl.
CPC .................................. *G01R 33/5605* (2013.01)

(58) Field of Classification Search
CPC .. G01R 33/56; G01R 33/5605; G01R 33/565; G01R 33/485; A61B 5/055
See application file for complete search history.

(56) References Cited

U.S. PATENT DOCUMENTS

| | | | |
|---|---|---|---|
| 4,706,023 A * | 11/1987 | Den Boef | G01R 33/565 324/309 |
| 4,949,042 A | 8/1990 | Kuhara et al. | |
| 5,226,418 A * | 7/1993 | Bernstein | F28D 9/0037 324/306 |
| 6,445,182 B1 | 9/2002 | Dean et al. | |
| 6,515,476 B1 | 2/2003 | Oshio et al. | |
| 6,597,172 B2 | 7/2003 | Miyoshi | |
| 7,068,031 B2 | 6/2006 | Miyoshi | |
| 7,336,986 B2 | 2/2008 | Miyoshi et al. | |
| 7,443,164 B2 * | 10/2008 | Clarke | G01R 33/3875 324/309 |
| 8,624,595 B2 | 1/2014 | Umeda | |
| 2011/0270075 A1 * | 11/2011 | Vitek | A61N 7/02 600/411 |
| 2011/0288402 A1 * | 11/2011 | Pikkemaat | G01R 33/5616 600/420 |

FOREIGN PATENT DOCUMENTS

DE   EP 2199815 A1 * 6/2010 ......... G01R 33/5601

* cited by examiner

*Primary Examiner* — Dixomara Vargas

(57) ABSTRACT

A magnetic resonance apparatus is provided. The magnetic resonance apparatus includes a scanner configured to execute a plurality of pulse sequences each including a plurality of RF pulses for generating magnetization transfer of protons and a data acquisition sequence for acquiring data from a region in which proton magnetization transfer occurs, wherein the phases of the plurality of RF pulses are cycled so as to make a phase difference between the phase of a pth RF pulse of the plurality of RF pulses and the phase of a p+1th RF pulse of the plurality of RF pulses different for each pulse sequence, and a controller configured to control operations that include processing for determining a spectrum indicative of a relationship between a signal intensity of each signal obtained from the region and the associated phase differences based on data obtained by executing the plurality of pulse sequences.

20 Claims, 18 Drawing Sheets

FIG. 5

| | PHASE DIFFERENCE $\Delta\phi(k)$ |
|---|---|
| FIRST PULSE SEQUENCE SE$_1$ | $\Delta\phi(1)=0$ |
| SECOND PULSE SEQUENCE SE$_2$ | $\Delta\phi(2)=\pi/8$ |
| THIRD PULSE SEQUENCE SE$_3$ | $\Delta\phi(3)=\pi/4$ |
| FOURTH PULSE SEQUENCE SE$_4$ | $\Delta\phi(4)=3\pi/8$ |
| FIFTH PULSE SEQUENCE SE$_5$ | $\Delta\phi(5)=\pi/2$ |
| SIXTH PULSE SEQUENCE SE$_6$ | $\Delta\phi(6)=5\pi/8$ |
| SEVENTH PULSE SEQUENCE SE$_7$ | $\Delta\phi(7)=3\pi/4$ |
| EIGHTH PULSE SEQUENCE SE$_8$ | $\Delta\phi(8)=7\pi/8$ |
| NINTH PULSE SEQUENCE SE$_9$ | $\Delta\phi(9)=\pi$ |
| TENTH PULSE SEQUENCE SE$_{10}$ | $\Delta\phi(10)=9\pi/8$ |
| ELEVENTH PULSE SEQUENCE SE$_{11}$ | $\Delta\phi(11)=5\pi/4$ |
| TWELFTH PULSE SEQUENCE SE$_{12}$ | $\Delta\phi(12)=11\pi/8$ |
| THIRTEENTH PULSE SEQUENCE SE$_{13}$ | $\Delta\phi(13)=3\pi/2$ |
| FOURTEENTH PULSE SEQUENCE SE$_{14}$ | $\Delta\phi(14)=13\pi/8$ |
| FIFTEENTH PULSE SEQUENCE SE$_{15}$ | $\Delta\phi(15)=7\pi/4$ |
| SIXTEENTH PULSE SEQUENCE SE$_{16}$ | $\Delta\phi(16)=15\pi/8$ |

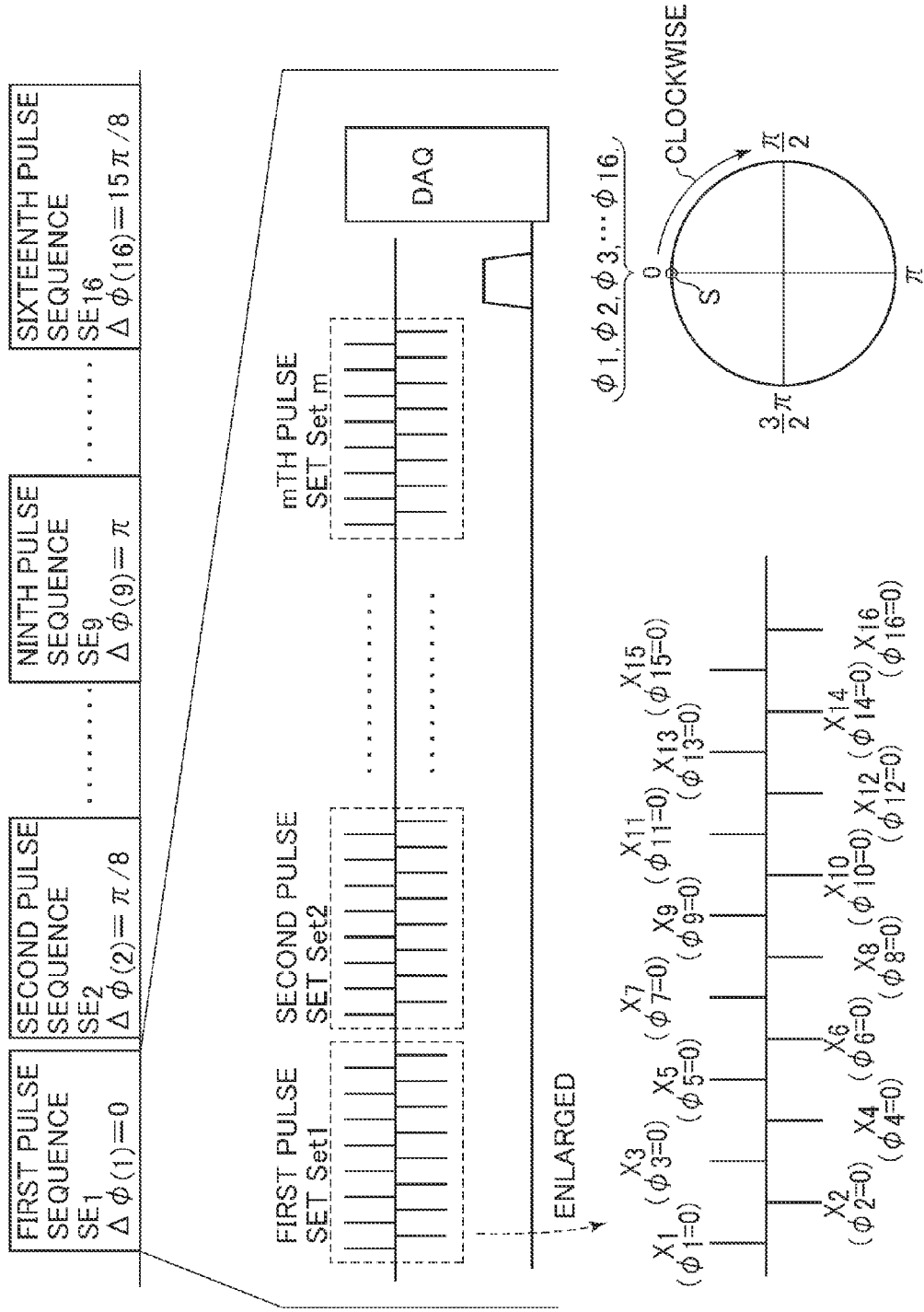

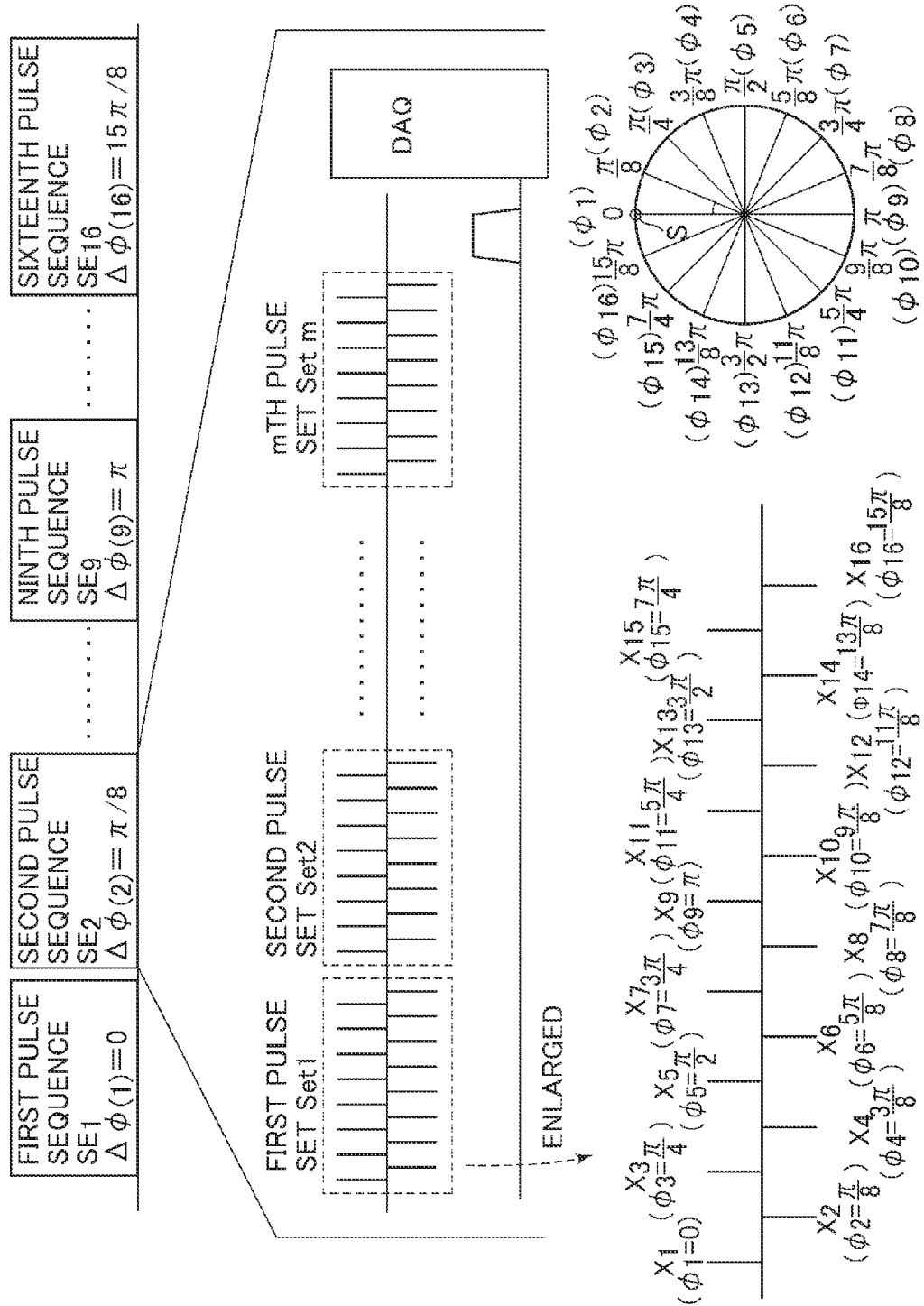

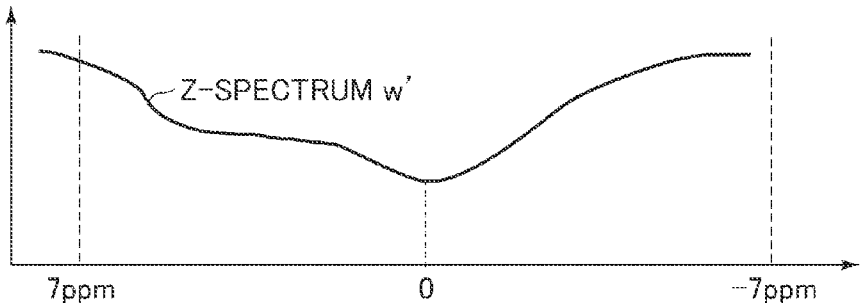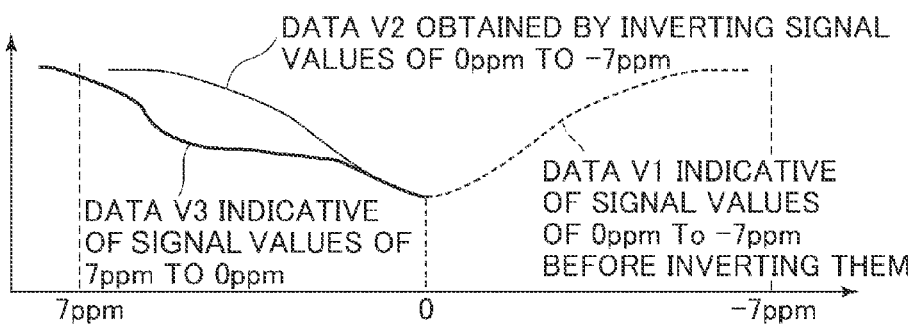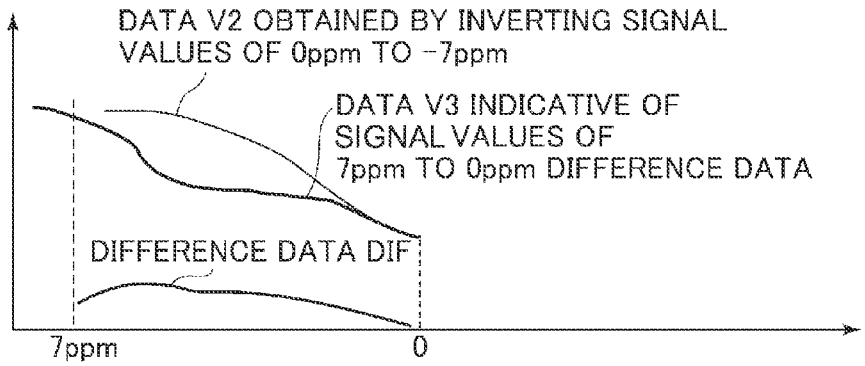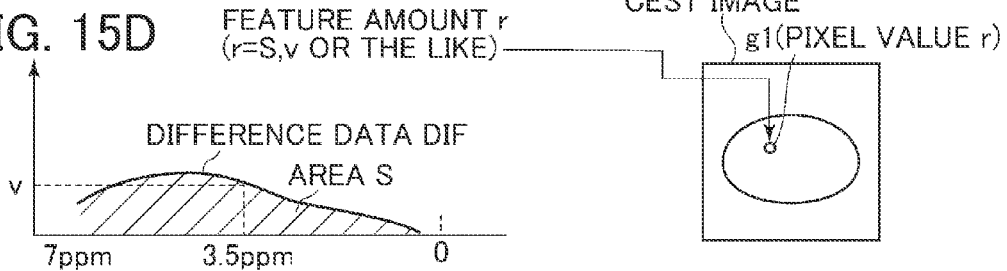

MAGNETIC RESONANCE APPARATUS AND METHOD USING THEREOF

CROSS REFERENCE TO RELATED APPLICATIONS

This application claims the benefit of Japanese Patent Application No. 2013-193483 filed Sep. 18, 2013, which is hereby incorporated by reference in its entirety.

BACKGROUND

The present invention relates to a magnetic resonance apparatus that acquires data of a region at which magnetization transfer of protons occurs, and a method using thereof.

There has heretofore been known a CEST (Chemical Exchange Saturation Transfer) method for detecting a phenomenon of magnetization transfer of protons (refer to Japanese Unexamined Patent Application Publication No. 2012-513239).

FIG. 18 is a diagram showing an example of a sequence used in a CEST method.

In the sequence shown in FIG. 18, preparation pulses are repeatedly executed. Each of the preparation pulses includes an RF pulse X and a killer gradient pulse K for achieving a steady state of vertical magnetization. After the preparation pulses are executed and an nth preparation pulse is executed, a data acquisition sequence DAQ for acquiring data is executed by a single shot method. A z-spectrum indicative of a relationship between the frequency and a signal value is generated based on the data obtained by executing the data acquisition sequence DAQ. FIG. 19 schematically shows an example of a z-spectrum obtained when the white of a raw egg is used as a phantom. FIG. 19 is a z-spectrum obtained when a flip angle α of an RF pulse X is set to α=90°. The horizontal axis of the z-spectrum indicates the frequency, and the vertical axis thereof indicates the signal value. Incidentally, the frequency of the horizontal axis of the z-spectrum follows the concept of MR spectroscopy. The high frequency side is shown in the left, and the low frequency side is shown in the right.

In the sequence shown in FIG. 18, the RF pulse X is set to have a shape like a Gaussian distribution or a Blackman filter (trigonometric function+constant) in order to reduce side lobes of the z-spectrum. It is understood that when the z-spectrum of FIG. 19 is seen, a single signal reduction peak appears and a side lobe is sufficiently reduced. Further, since the z-spectrum causes a shift in center frequency under the influence of ununiformity in static magnetic field, it is necessary to correct the shift in its center frequency. If, however, the single signal reduction peak appears as shown in FIG. 19, the shift in the center frequency can also be easily corrected.

There is however a case where in the z-spectrum of FIG. 19, the signal reduction peak hardly appears in a proton's frequency fcest at which one desires to see a CEST effect, and hence the CEST effect is hard to be recognized. As a method for coping with such a problem, there is considered that the flip angle α of each RF pulse is set large (refer to FIG. 20).

FIG. 20 shows a z-spectrum obtained when the flip angle α of the RF pulse X is set to α=360°.

In FIG. 20, a certain degree of signal reduction is seen in the position of the proton's frequency fcest at which one desires to detect or look at the CEST effect because the flip angle α of the RF pulse X is set to α=360°. It is thus possible to recognize the signal reduction due to the CEST effect. When, however, the flip angle α of the RF pulse X is increased, side lobes of the z-spectrum are conspicuous so that a plurality of signal reduction peaks appear in the vicinity of the center frequency. Thus, since it is hard to find out the position of the center frequency when the signal reduction peaks appear, a problem arises in that it is hard to correct a shift in the center frequency.

Accordingly, there is a demand for a technology for obtaining a z-spectrum in which a signal reduction due to a CEST effect can sufficiently be confirmed and side lobes are reduced.

BRIEF DESCRIPTION

In a first aspect, a magnetic resonance apparatus is provided. In the magnetic resonance apparatus, pulse sequences each including a plurality of RF pulses for generating magnetization transfer of protons, and a data acquisition sequence for acquiring data from a region in which proton magnetization transfer takes place are executed plural times. The magnetic resonance apparatus has scan means that cycles the phases of the RF pulses so as to make a phase difference between the phase of the pth RF pulse of the RF pulses and the phase of the p+1th RF pulse thereof different for every pulse sequence to thereby execute the pulse sequences plural times, and means that determines a spectrum indicative of a relationship between a signal intensity of each signal obtained from the region and the phase difference on the basis of data obtained by executing the pulse sequences plural times.

In a second aspect, a program is provided. The program is applied to a magnetic resonance system in which pulse sequences each including a plurality of RF pulses for generating magnetization transfer of protons, and a data acquisition sequence for acquiring data from a region in which proton magnetization transfer takes place are executed plural times, and which cycles the phases of the RF pulses so as to make a phase difference between the phase of the pth RF pulse of the RF pulses and the phase of the p+1th RF pulse thereof different for every pulse sequence to thereby execute the pulse sequences plural times. The program causes a computer to execute a process for determining a spectrum indicative of a relationship between a signal intensity of each signal obtained from the region and the phase difference on the basis of data obtained by executing the pulse sequences plural times.

The phase of each RF pulse is cycled in such a manner that a difference in phase between RF pulses differs for every pulse sequence. Thus, a spectrum can be generated using RF pulses of a rectangular wave (or shape near the rectangular wave) instead of RF pulses each having a shape like a Gaussian distribution or a Blackman filter. Since it is possible to shorten a time interval between the RF pulses by using the RF pulses of the rectangular wave (or shape near the rectangular wave), a flip angle per unit time can be made large even if the flip angle of one RF pulse is small. Thus, a CEST effect can sufficiently be detected even if the flip angle of each individual RF pulse is small. Further, since the flip angle of one RF pulse can be made small, it is possible to obtain a spectrum whose side lobes are reduced.

BRIEF DESCRIPTION

FIG. 5 is a diagram showing the values of phase differences $\Delta\phi(1)$ to $\Delta\phi(16)$ in respective pulse sequences obtained from an Equation 2.

FIG. 6 is an explanatory diagram when the phase of an RF pulse is cycled in the first pulse sequence $SE_1$.

FIG. 7 is an explanatory diagram when the phase of an RF pulse is cycled in the second pulse sequence $SE_2$.

FIGS. 15A-15E are diagrams illustrating a method for generating a CEST image.

DETAILED DESCRIPTION

While exemplary embodiments will hereinafter be described, the disclosure is not limited to or by the following exemplary embodiments.

Figure 1:
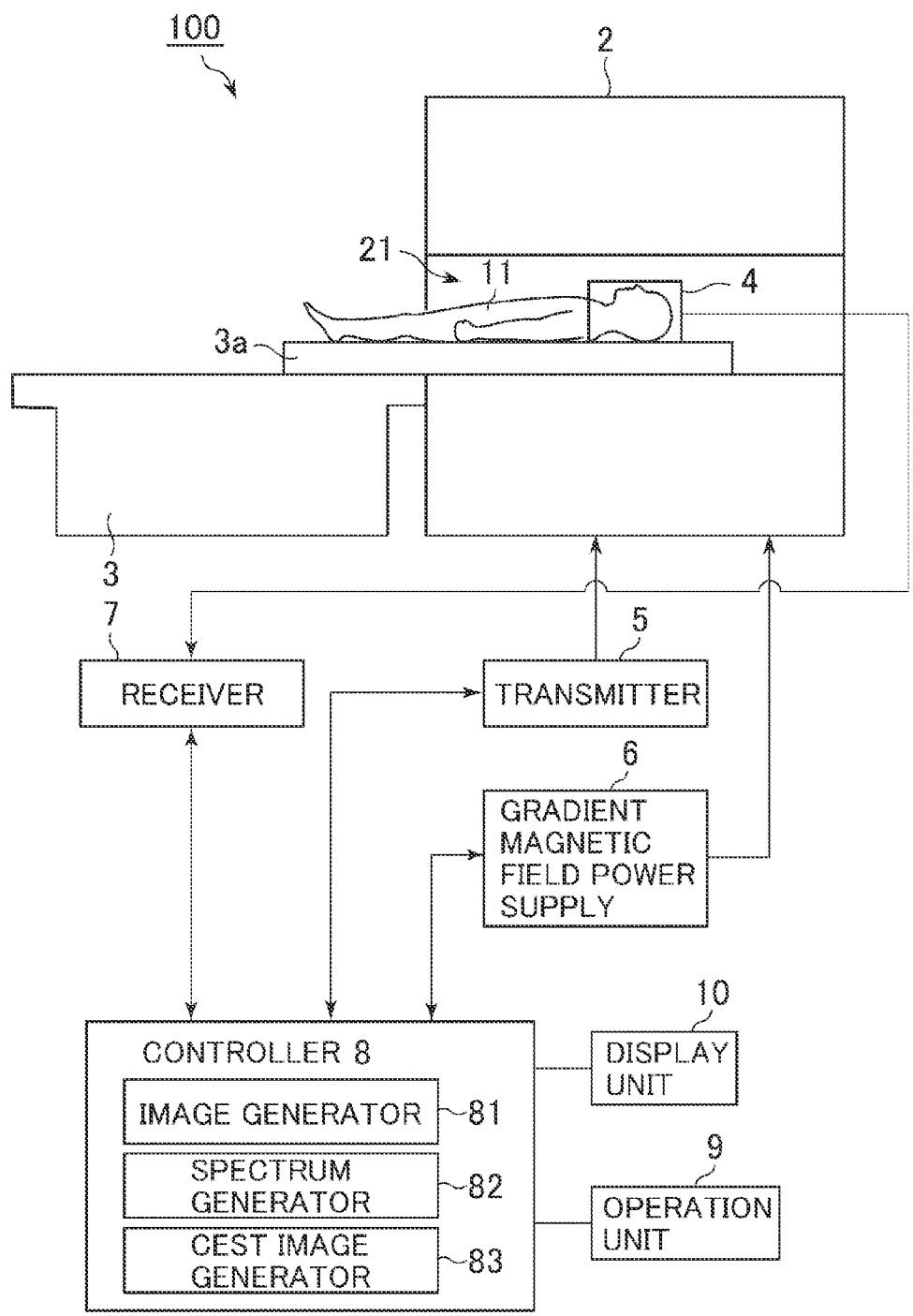
FIG. 1 is a schematic diagram of a magnetic resonance apparatus according to an exemplary embodiment.

FIG. 1 is a schematic diagram of a magnetic resonance apparatus according to an exemplary embodiment.

The magnetic resonance apparatus (hereinafter called "MR apparatus" where MR: Magnetic Resonance) 100 has a magnet 2, a table 3, a receiving coil 4, etc.

The magnet 2 has a bore 21 in which a subject 11 is accommodated. Further, the magnet 2 incorporates a superconductive coil, a gradient coil, an RF coil, etc. therein.

The table 3 has a cradle 3a that supports the subject 11. The cradle 3a is configured so as to be movable into the bore 21. The subject 11 is carried in the bore 21 by the cradle 3a.

The receiving coil 4 is attached to the subject 11. The receiving coil 4 receives magnetic resonance signals from the subject 11 therein.

The MR apparatus 100 further has a transmitter 5, a gradient magnetic field power supply 6, a receiver 7, a controller 8, an operation unit 9 and a display unit 10, etc.

The transmitter 5 supplies current to the RF coil. The gradient magnetic field power supply 6 supplies current to the gradient coil. The receiver 7 performs signal processing such as detection on a signal received from the receiving coil 4. Incidentally, the combination of the magnet 2, receiving coil 4, transmitter 5, gradient magnetic field power supply 6, and the receiver 7 is equivalent to scan means (scanner).

The controller 8 controls the operations of respective parts of the MR apparatus 100 so as to realize various operations of the MR apparatus 100 such as transmission of information necessary for the display unit 10, reconstruction of an image on the basis of data received from the receiving coil 4, etc. The controller 8 has image generator 81, spectrum generator 82, and CEST image generator 83, etc.

The image generator 81 generates images, based on data obtained by pulse sequences $SE_1$ to $SE_{16}$ (refer to FIG. 11) to be described later.

The spectrum generator 82 generates a z-spectrum, based on the images obtained by the image generator 81.

The CEST image generator 83 generates a CEST image, based on the z-spectrum.

Incidentally, the controller 8 is an example that configures the image generator 81, the spectrum generator 82, and the CEST image generator 83. The controller 8 functions as these means by executing a prescribed program.

The operation unit 9 is operated by an operator and inputs various information to the controller 8. The display unit 10 displays the various information thereon.

The MR apparatus 100 is configured in the above-described manner.

Figure 2:
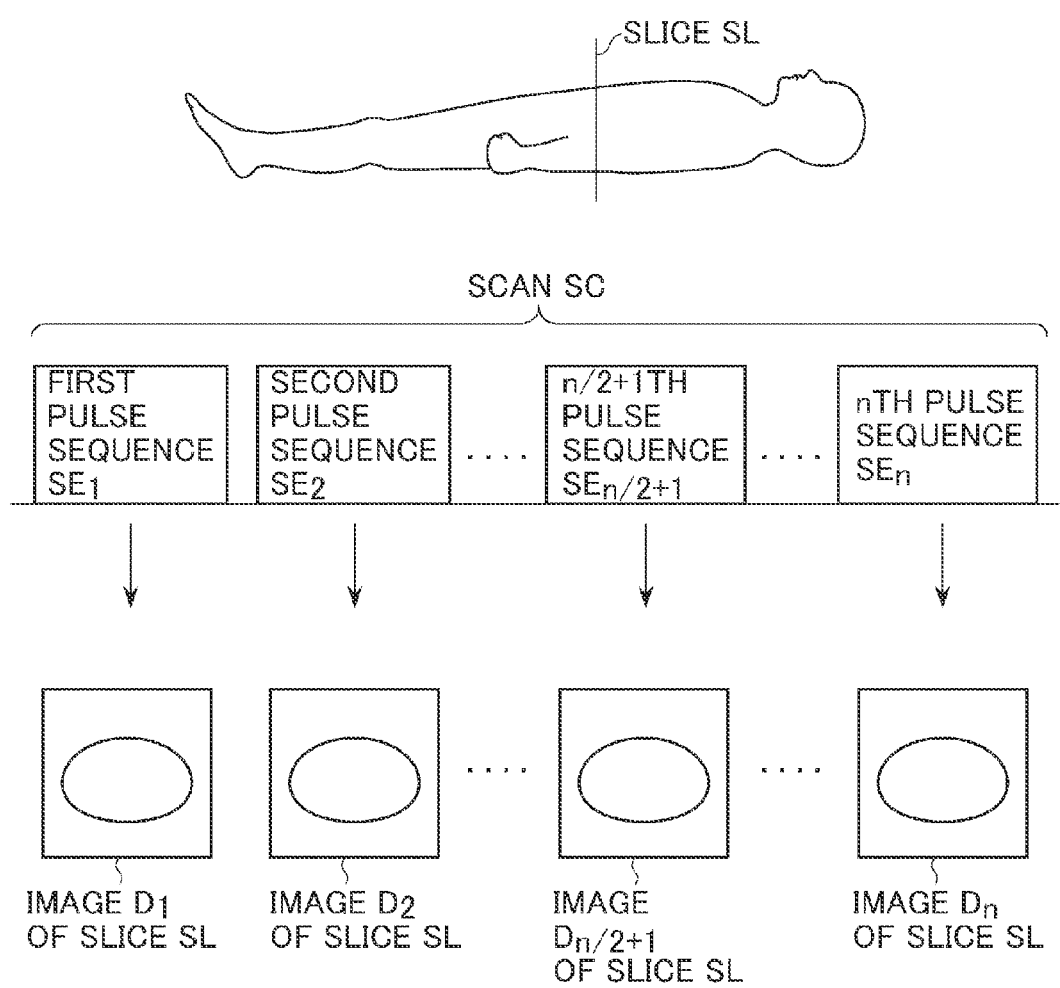
FIG. 2 is an explanatory diagram of a scan executed in the exemplary embodiment.

FIG. 2 is an explanatory diagram of a scan executed in the exemplary embodiment.

The scan SC is a scan for acquiring each image of a slice using the CEST method. In the scan SC, a pulse sequence $SE_k$ (where k=1 to n) for acquiring a slice's image $D_k$ is executed. In the exemplary embodiment, since the pulse sequence $SE_k$ is executed n times, n images $D_1$ to $D_n$ can be acquired by executing the scan SC.

Figure 3:
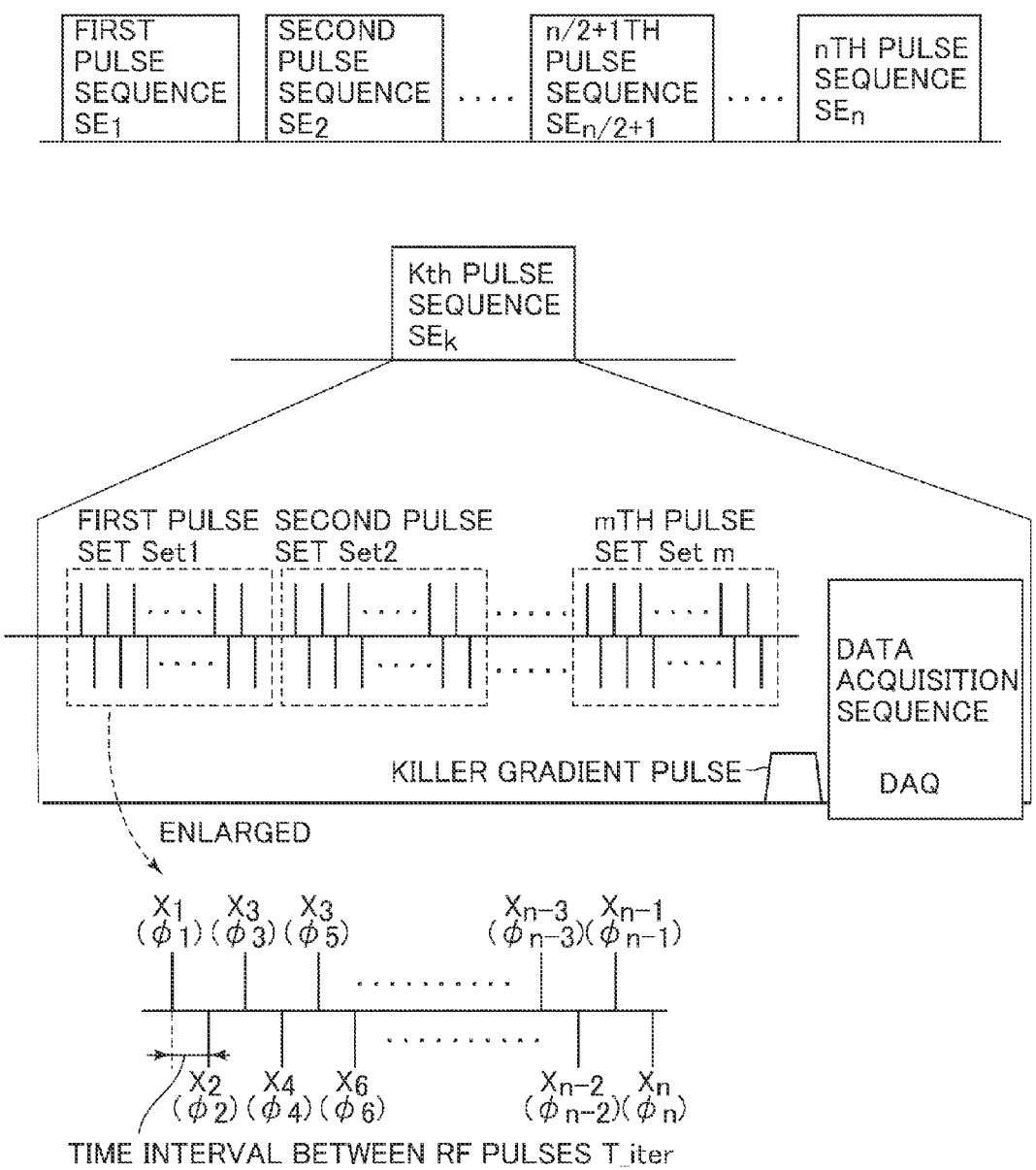
FIG. 3 is a diagram specifically illustrating a pulse sequence SEk in the exemplary embodiment.

FIG. 3 is a diagram concretely showing the pulse sequence SEk in the exemplary embodiment.

The kth pulse sequence $SE_k$ has first to mth pulse sets Set1 to Setm, a killer gradient pulse, and a data acquisition sequence DAQ. The first to mth pulse sets Set1 to Setm will first be described below. Incidentally, since the first to mth pulse sets Set1 to Setm are identical in configuration, the first pulse set Set1 will be taken up and described as a representative upon describing the first to mth pulse sets Set1 to Setm.

The first pulse set Set1 is shown in FIG. 3 in an enlarged form.

The first pulse set Set1 has n RF pulses X1 to Xn for generating magnetization transfer of protons. The RF pulses X1 to Xn are configured in such a manner that positive and negative RF pulses appear alternately. The RF pulses X1 to Xn are respectively applied at a prescribed time interval T_iter. A description will be made below about how to concretely determine the time interval T_iter. "$\phi 1$" to "$\phi n$" described below symbols "X1" to "Xn" respectively represent the phase of the RF pulse.

A description will next be made about the phases $\phi 1$ to $\phi n$ of the n RF pulses X1 to Xn. First consider the pth RF pulse Xp and the p+1th RF pulse Xp+1 in the n RF pulses X1 to Xn (incidentally, p is $1 \le p \le n-1$). When the phase of the pth RF pulse Xp is expressed in "$\phi p$", and the phase of the p+1th RF pulse Xp+1 is expressed in "$\phi p+1$", a phase difference $\Delta\phi(k) = \phi p+1 - \phi p$ between the RF pulses in the kth pulse sequence $SE_k$ is set so as to satisfy the following equation.

$$\Delta\phi(k) = \phi_{p+1} - \phi_p \qquad \text{Equation 1}$$
$$= \frac{2\pi \ast (k-1)}{n}$$

where n: the number of times the pulse sequence is executed. It is understood from Equation 1 that the phase difference Δϕ (k) is set to change according to the value of k. A description will be made in detail later about how the phase difference Δϕ (k) changes.

While the first pulse set Set1 is shown in FIG. 3, the second to mth pulse sets Set2 to Setm are also the same in configuration as the first pulse set Set1. Thus, any of the pulse sets has the n RF pulses X1 to Xn. The phase difference Δϕ (k) between the RF pulses is set to satisfy Equation 1.

After the application of the first to mth pulse sets Set1 to Setm, a killer gradient pulse for extinguishing the transverse magnetization is applied. Then, after the application of the killer gradient pulse, a data acquisition sequence DAQ for acquiring data of proton frequencies at which one desires to look at a CEST effect is executed. Here, the data acquisition sequence DAQ is taken to acquire data by a single shot method.

Figure 4:
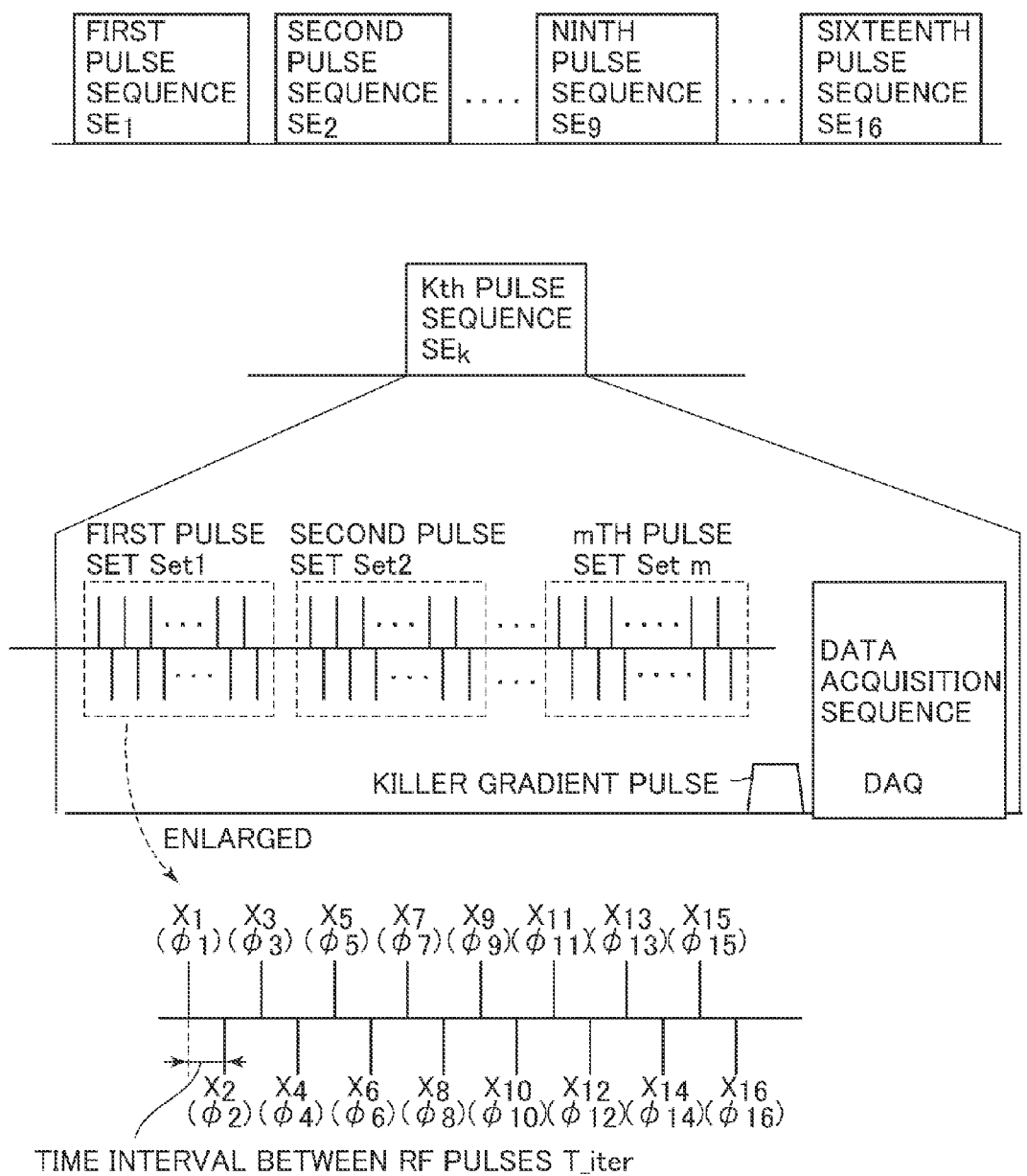
FIG. 4 is a diagram showing an example of a pulse sequence where n=16.

The kth pulse sequence SEk is configured in the above-described manner. In the present embodiment, the pulse sequence SEk is executed n times. Incidentally, since a z-spectrum high in frequency resolution is obtained as the number n of pulses sequences to be executed increases, n is desirably a value large to some extent. Generally, n is considered to be set to n=16 to 32. FIG. 4 shows an example of a pulse sequence where n=16. When n=16, the pulse sequence is executed sixteen times, and pulse sets included in the respective pulse sequences are configured to have sixteen RF pulses. When n=16, the phase difference Δϕ (k) between the RF pulses in the kth pulse sequence SEk is determined by substituting n=16 into Equation 1:

$$\Delta \phi(k) = \frac{2\pi * (k-1)}{16}$$ Equation 2

A description will next be made about how the phase difference Δϕ (k) between the RF pulses changes depending on the value of k. Incidentally, in order to facilitate understanding, consider below where n=16, i.e., where the pulse sequences $SE_1$ to $SE_{16}$ shown in FIG. 4 are executed. Thus, the phase difference Δϕ (k) is taken to be expressed in Equation 2.

The values which k can take when n=16 are integers ranging from 1 to 16. Thus, the phase differences Δϕ (1) to Δϕα (16) of the RF pulses in the first pulse sequence $SE_1$ to the sixteenth pulse sequence $SE_{16}$ can be determined by substituting the values of 1 to 16 into k in Equation 2. FIG. 5 shows the values of the phase differences Δϕ (1) to Δϕ (16) in the respective sequences, which are determined by the equation (2). It is understood from FIG. 5 that the phase differences Δϕ (1) to Δϕ (16) are different values.

In the exemplary embodiment, the phase of the RF pulse in each pulse sequence is cycled based on the phase differences Δϕ(1) to Δϕ(16). A description will be made below about how the phase of the RF pulse is cycled.

FIG. 6 is an explanatory diagram when the phase of the RF pulse is cycled in the first pulse sequence $SE_1$.

In the first pulse sequence $SE_1$, the phase difference Δϕ (1) of the RF pulse is Δϕ (1)=0 (rad). Thus, in the first pulse sequence $SE_1$, the phases ϕ1 to ϕ16 are cycled so that the phase difference becomes 0. The manner in which the phases ϕ1 to ϕ16 are cycled is shown in the lower right of FIG. 6, using a circle. A point s is on the circumference of the circle indicates the position of the phase 0 (rad). The value of the phase becomes larger as the phase moves clockwise from the point s. When the phase goes around the circle, the phase is returned to 0. For convenience of explanation, in the present embodiment, the phase ϕ1 is taken to be set to ϕ1=0 (rad). Thus, the phases ϕ1 to ϕ16 can be determined by cycling the phase in such a manner that the phase is increased 0 by 0 from the phase ϕ1=0 (i.e., the phase does not change). Since the phase does not change, the phases ϕ1 to ϕ16 are set to the same phase (i.e., 0).

A description will next be made about how the phase of the RF pulse is cycled in the second pulse sequence $SE_2$ (refer to FIG. 7).

FIG. 7 is an explanatory diagram when the phase of the RF pulse is cycled in the second pulse sequence $SE_2$.

In the second pulse sequence $SE_2$, the pulse difference Δϕ (2) of the RF pulse is Δϕ (2)=π/8. Thus, in the second pulse sequence $SE_2$, the phases ϕ1 to ϕ16 are cycled in such a manner that the phase difference becomes π/8. The manner when the phases ϕ1 to ϕ16 are cycled is shown in the lower right of FIG. 7, using the circle. In the present embodiment, since the phase ϕ1 is set to ϕ1=0, the phases ϕ1 to ϕ16 can be determined by cycling the phase in such a manner that the phase is increased π/8 by π/8 from the phase ϕ1=0.

Figure 8:
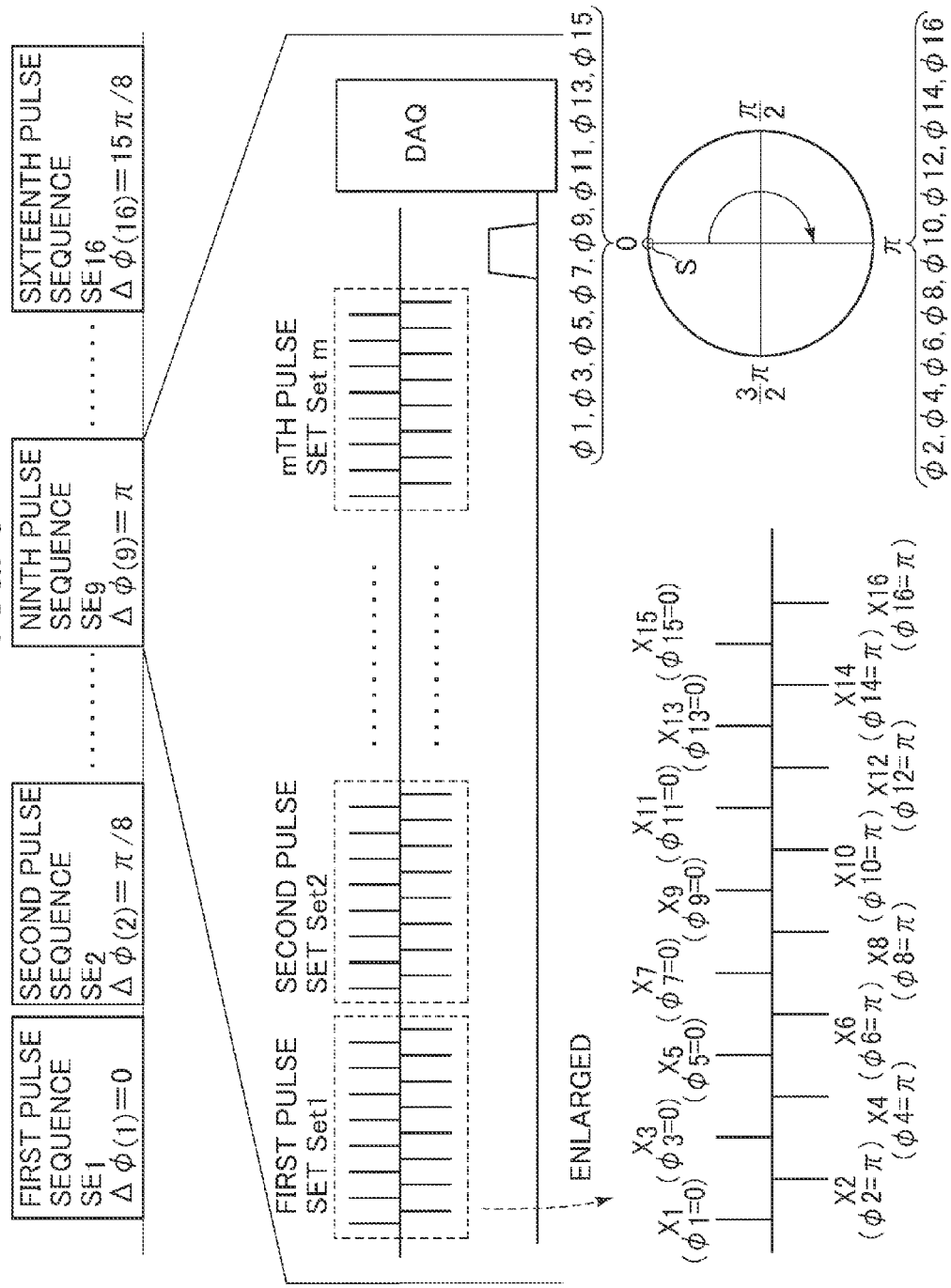
FIG. 8 is an explanatory diagram when the phase of an RF pulse is cycled in the ninth pulse sequence $SE_9$.

Even in the third to sixteenth pulse sequences $SE_3$ to $SE_{16}$, the phases ϕ1 to ϕ16 can be determined by cycling the phases ϕ1 to ϕ16 in such a manner that the phase is increased by the phase difference Δϕ (k) shown in FIG. 5. FIG. 8 shows the way of cycling the phase of the RF pulse in the ninth pulse sequence $SE_9$.

In the ninth pulse sequence $SE_9$, the phase difference Δϕ (9) of the RF pulse is Δϕ (9)=π. Thus, in the ninth pulse sequence $SE_9$, the phases ϕ1 to ϕ16 are cycled in such a manner that the phase difference becomes π. The manner when the phases ϕ1 to ϕ16 are cycled is shown in the lower right of FIG. 8, using a circle. In the present embodiment, since the phase ϕ1 is set to ϕ1=0, the phases ϕ1 to ϕ16 can be determined by cycling the phase in such a manner that the phase is increased π by π from the phase ϕ1=0.

Figure 9:
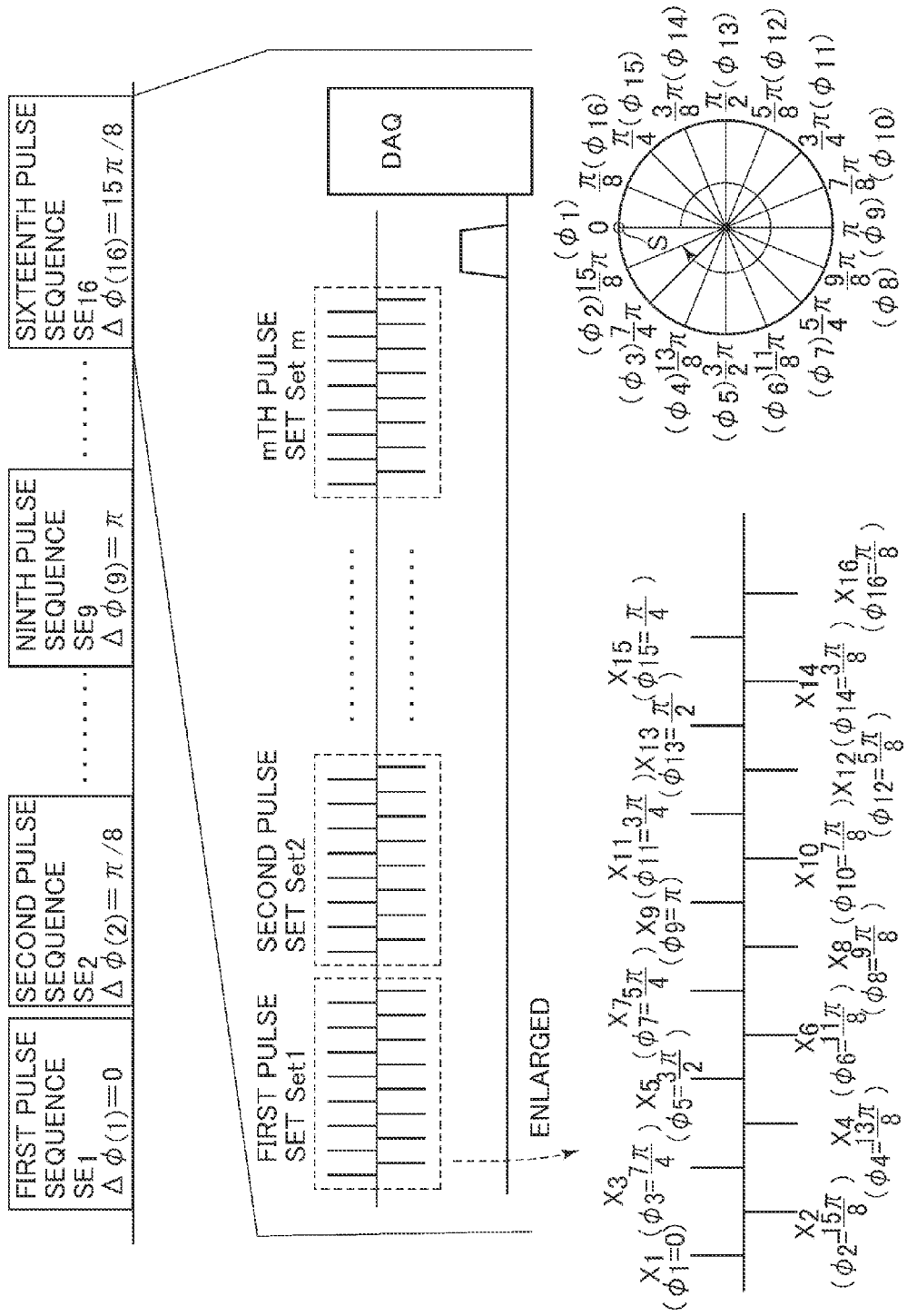
FIG. 9 is an explanatory diagram when the phase of an RF pulse is cycled in the sixteenth pulse sequence $SE_{16}$.

A description will at last be made about how the phase of the RF pulse is cycled in the sixteenth pulse sequence $SE_{16}$ (refer to FIG. 9).

FIG. 9 is an explanatory diagram when the phase of the RF pulse is cycled in the sixteenth pulse sequence $SE_{16}$.

In the sixteenth pulse sequence $SE_{16}$, the phase difference Δϕ (16) of the RF pulse is Δϕ (16)=15π/8. Thus, in the sixteenth pulse sequence $SE_{16}$, the phases ϕ1 to ϕ16 are cycled in such a manner that the phase difference becomes 15π/8. The manner when the phases ϕ1 to ϕ16 are cycled is shown in the lower right of FIG. 9, using a circle. In the present embodiment, since the phase ϕ1 is set to ϕ1=0, the phases ϕ1 to ϕ16 can be determined by cycling the phase in such a manner that the phase is increased 15π/8 by 15π/8 from the phase ϕ1=0.

In the exemplary embodiment, the pulse sequences are executed while cycling the phases of the plural RF pulses X1 to X16. Thus, an RF pulse of a rectangular wave (or shape near the rectangular wave) can be used instead of the RF pulse (RF pulse having the shape like the Gaussian distribution or Blackman filter) used in the conventional method. Since the time interval T_iter (refer to FIG. 4) between the RF pulses can be shortened by using the RF pulse of the rectangular wave (or shape near the rectangular wave), a flip angle per unit time can be made large even if a flip angle α of one RF pulse is small. Thus, the CEST effect can be enlarged even though the flip angle of each individual RF pulse is small. In the present embodiment, the flip angles α of the RF pulses X1 to X16 are taken to be α=5°.

In the exemplary embodiment, the pulse sequences $SE_1$ to $SE_{16}$ to each of which the phase difference Δϕ (k) between the RF pulses is set to satisfy the above conditions are executed. The CEST image is generated based on the data obtained by the pulse sequences $SE_1$ to $SE_n$. A description will be made below about a flow used when the CEST image is generated.

Figure 10:
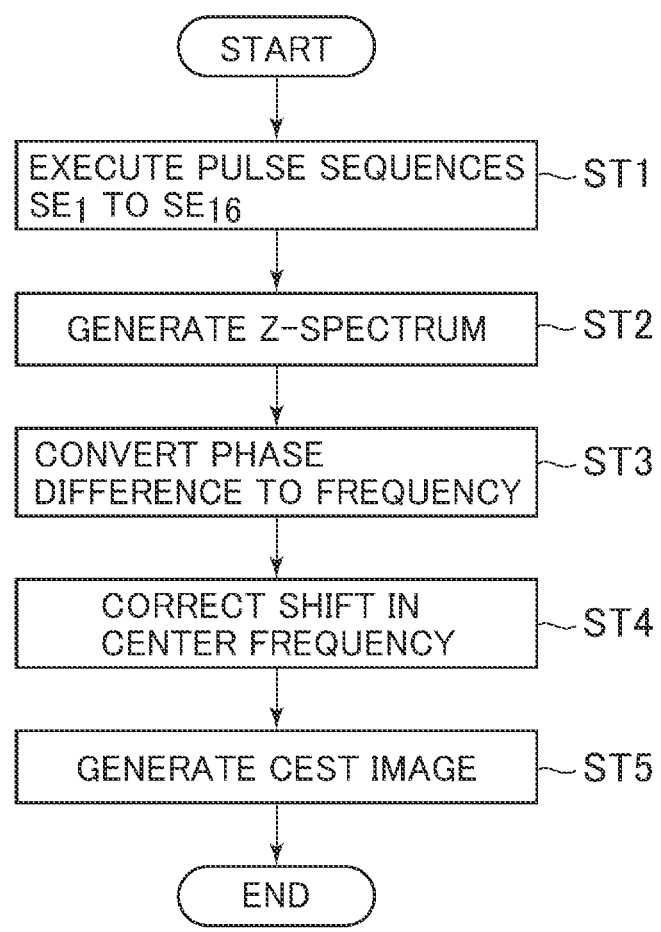
FIG. 10 is a diagram showing a flow used when a CEST image is generated.

FIG. 10 is a diagram showing the flow used when generating the CEST image.

Figure 11:
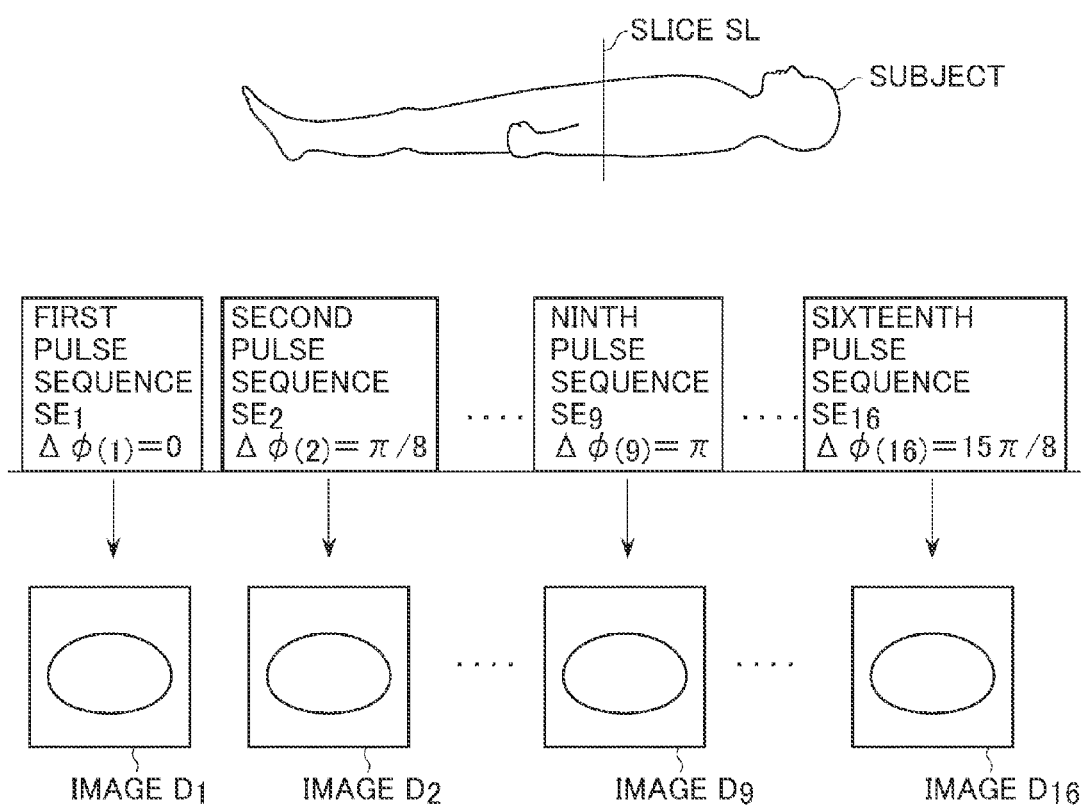
FIG. 11 is a diagram schematically showing sixteen images $D_1$ to $D_{16}$ of a slice SL obtained by executing the pulse sequences $SE_1$ to $SE_{16}$.

In Step ST1, the pulse sequences $SE_1$ to $SE_{16}$ are executed. The image generator 81 (refer to FIG. 1) generates images of a slice SL for every pulse sequence, based on the data obtained by the pulse sequences $SE_1$ to $SE_{16}$. FIG. 11 schematically shows sixteen images $D_1$ to $D_{16}$ of the slice SL obtained by executing the pulse sequences $SE_1$ to $SE_{16}$. Since the phase difference $\Delta\phi$ (k) between each RF pulse in the pulse sequences SE1 to SE16 is set to values different from each other, the images $D_1$ to $D_{16}$ when the phase difference $\Delta\phi$ (k) therebetween is changed to sixteen can be obtained by executing the pulse sequences $SE_1$ to $SE_{16}$. After the execution of the pulse sequences $SE_1$ to $SE_{16}$, the flow proceeds to Step ST2.

Figure 12:
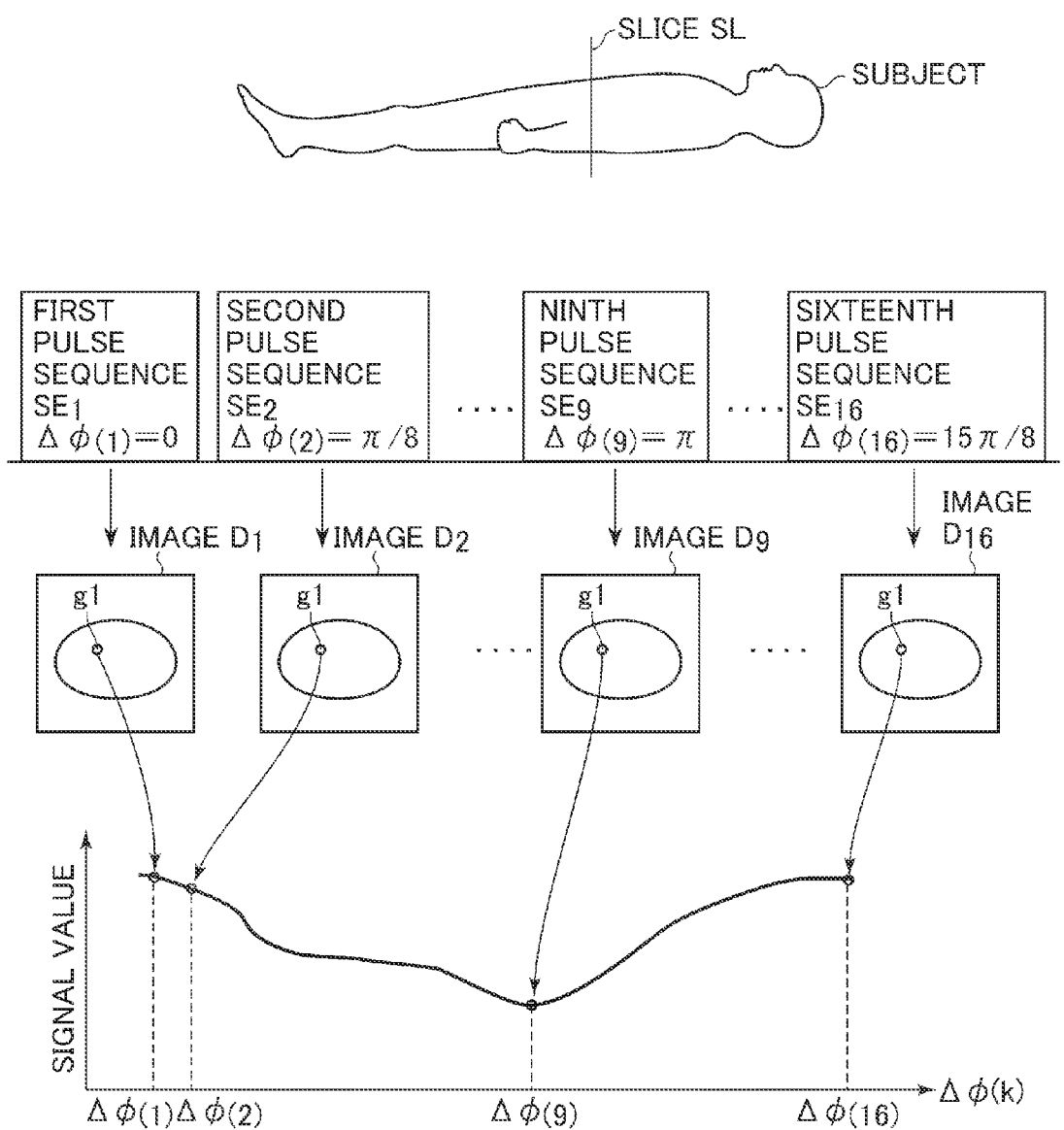
FIG. 12 is a diagram illustrating a z-spectrum.

In Step ST2, the spectrum generator 82 (refer to FIG. 1) generates a z-spectrum. FIG. 12 shows the z-spectrum. The spectrum generator 82 extracts pixels lying in the same position of the images $D_1$ to $D_{16}$ and generates a z-spectrum indicative of a relationship between a phase difference $\Delta\phi$ (k) and each signal value. While the z-spectrum related to the pixels g1 lying in the same position of the images $D_1$ to $D_{16}$ is shown in FIG. 12, a z-spectrum related to other pixels is also generated.

After the generation of the z-spectrum, the flow proceeds to Step ST3.

In Step ST3, the spectrum generator 82 converts the phase difference $\Delta\phi$ (k) on the horizontal axis of the z-spectrum into a frequency (ppm). A description will be made below about a method of converting the phase difference $\Delta\phi$ (k) into the frequency (ppm). The frequency f can be determined by the following equation:

$$f = \frac{1}{BoXr} * \frac{\Delta\phi(k) - \pi}{2\pi T\_iter * 10^{-3}} \quad \text{Equation 3}$$

where f: frequency (ppm),
Bo: static magnetic field intensity (T),
r: magnetic speed ratio (MHz/T),
$\Delta\phi(k)$: phase difference (rad), and
T_iter: time interval between RF pulses (msec).

Here, in the present embodiment, B0=1.5 (T), and γ=42.58 MHz/T. Thus, Equation 3 can be represented by the following Equation 4:

$$f = \frac{1}{(1.5T \times 42.58 \text{ MHz}/T)} * \frac{\Delta\phi(k - \pi)}{2\pi T\_iter * 10^{-3}} \quad \text{Equation 4}$$

Assuming that the frequency of hydrogen at which one desires to look at the CEST effect, is fcest (ppm), the time interval T_iter is represented by the following equation:

$$T\_iter = \frac{1}{(1.5T \times 42.58 \text{ MHz}/T)} * \frac{1}{fcest * q * 10^{-3}} \quad \text{Equation 5}$$

where q: constant

Thus, if fcest and q in Equation 5 are determined, it is possible to determine the time interval T_iter between the RF pulses. Incidentally, in the following description, q is taken to be q=4. The reason why q=4 will be described later. If q=4, Equation 5 is represented by the following Equation 6:

$$T\_iter = \frac{1}{(1.5T \times 42.58 \text{ MHz}/T)} * \frac{1}{fcest * 4 * 10^{-3}} \quad \text{Equation 6}$$

Thus, the time interval T_iter between the RF pulses can be determined by substituting the value of the frequency fcest (ppm) of hydrogen at which one desires to look at the CEST effect into Equation 6. In the exemplary embodiment, fcest is taken to be fcest=3.5 ppm (proton of amino group). T_iter can be determined as shown below by substituting fcest=3.5 ppm into Equation 6:

$$T\_iter = \frac{1}{(1.5T \times 42.58 \text{ MHz}/T)} = \frac{1}{3.5 * 4 * 10^{-3}} = 1.118 \text{ ms} \quad \text{Equation 7}$$

Substituting T_iter=1.118 ms into Equation 4 yields the following equation:

$$f = \frac{1}{(1.5T \times 42.58 \text{ MHz}/T)} * \frac{\Delta\phi(k) - \pi}{2\pi \times 1.118 \text{ ms} * 10^{-3}} \quad \text{Equation 8}$$

Figure 13:
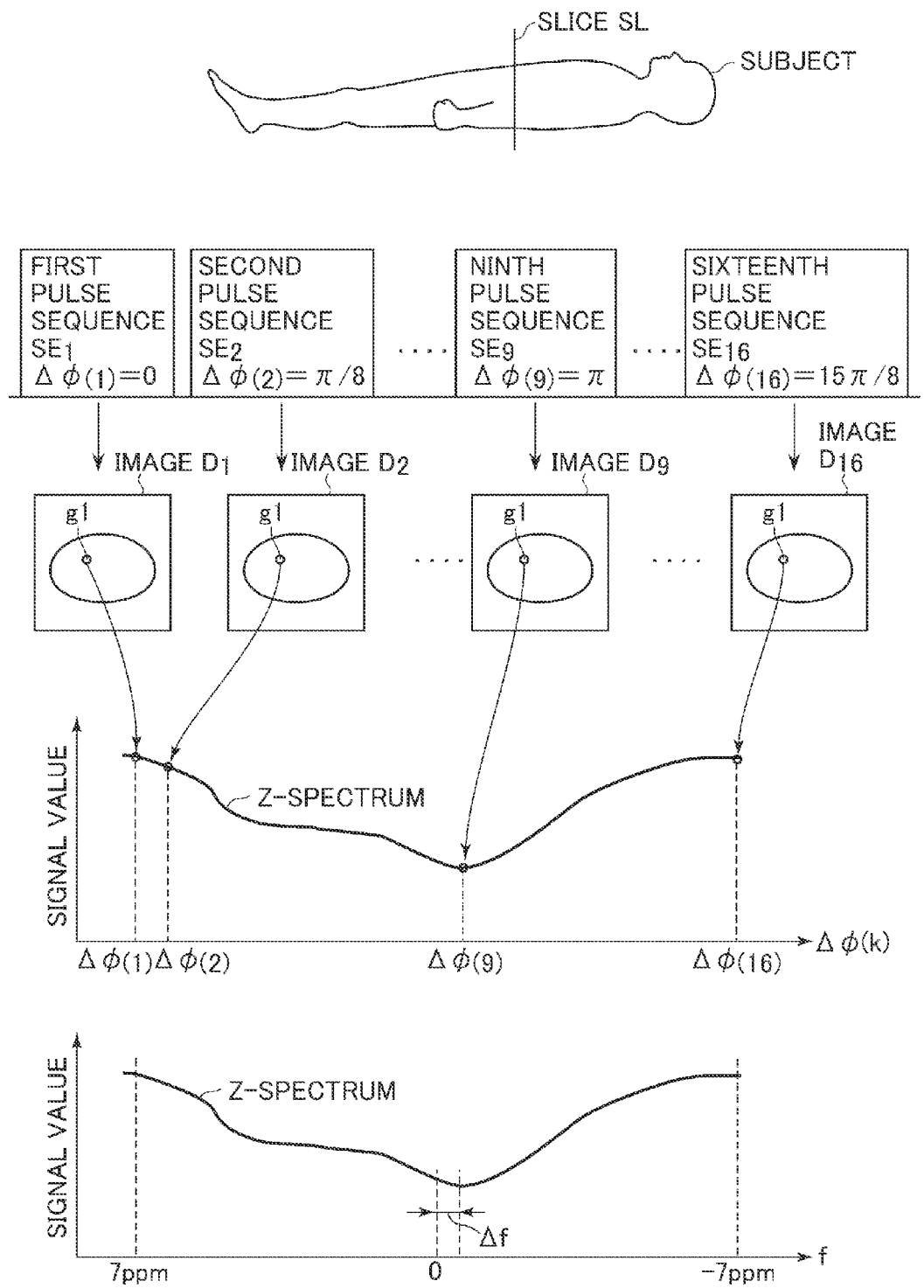
FIG. 13 is a diagram showing a z-spectrum after each phase difference is converted into a frequency.

Since the frequency f (ppm) is represented by variables of $\Delta\phi$ (k) from the equation (8), the phase reference $\phi$ (k) can be converted to the frequency f. FIG. 13 shows a z-spectrum after the phase difference $\phi$ (k) is converted to the frequency f.

Incidentally, the z-spectrum may be shifted in center frequency by being affected by ununiformity in static magnetic field. The manner in which the center frequency is shifted by $\Delta f$ is shown in FIG. 13. Therefore, the flow proceeds to Step ST4 to correct the shift $\Delta f$ in the center frequency.

Figure 14:
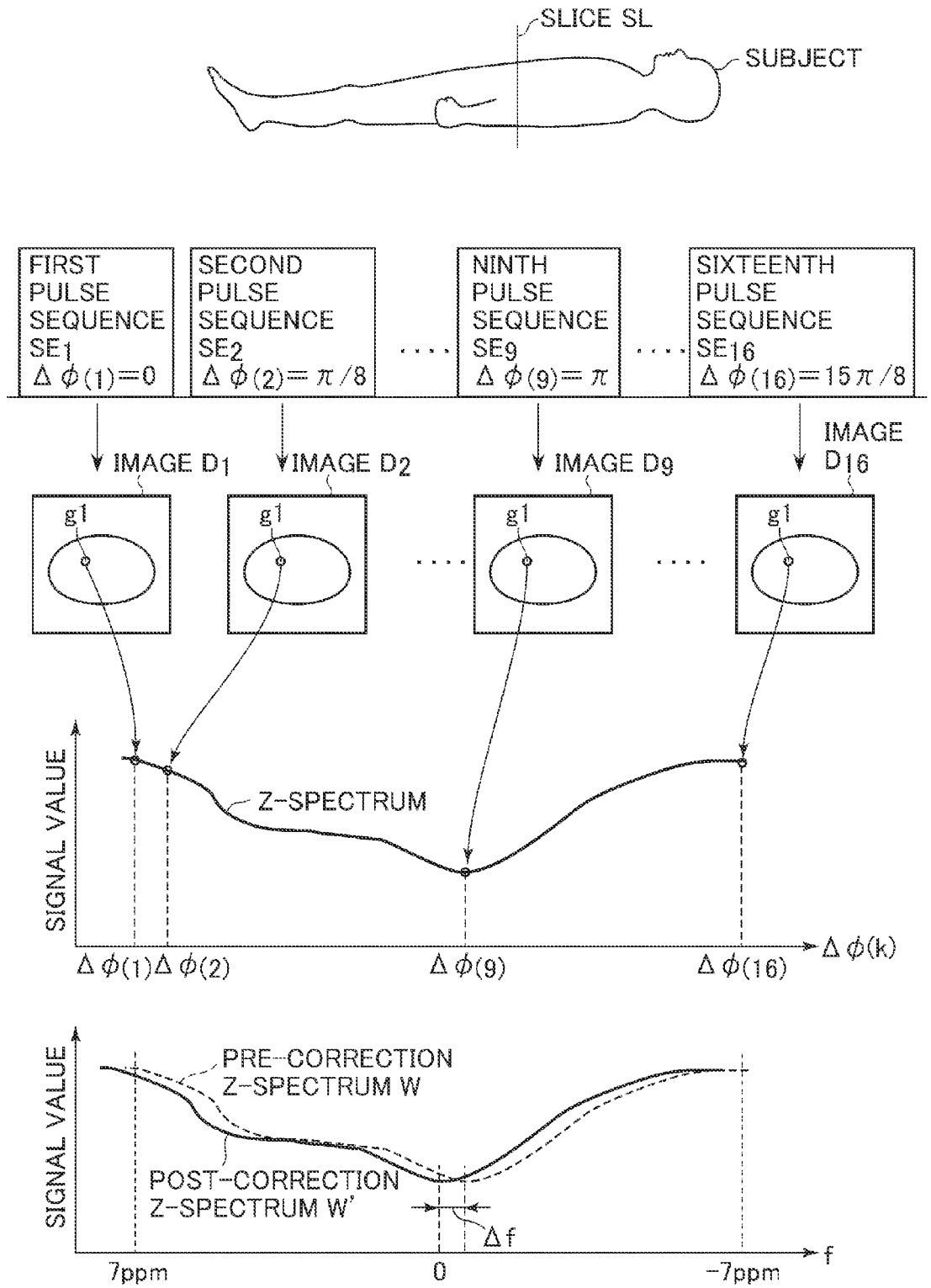
FIG. 14 is a diagram showing a z-spectrum w' obtained by correcting a shift $\Delta f$ in center frequency.

In Step ST4, the spectrum generator 82 corrects the shift $\Delta f$ in the center frequency of the z-spectrum w. FIG. 14 shows a z-spectrum w' obtained by correcting the shift $\Delta f$ in the center frequency. In FIG. 14, the z-spectrum w prior to the correction of the shift $\Delta f$ in the center frequency is indicated by a broken line, and the z-spectrum w' after the correction of the shift $\Delta f$ in the center frequency is indicated by a solid line, respectively.

Figure 20:
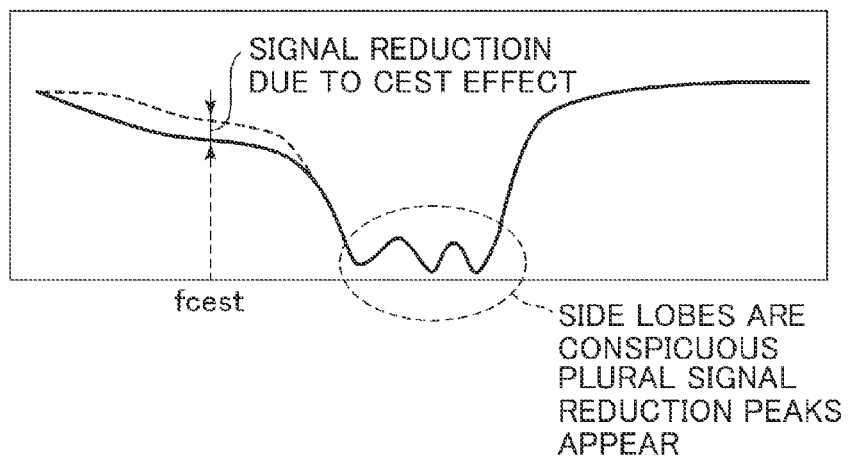
FIG. 20 is a diagram schematically illustrating an example of a z-spectrum obtained when the white of a raw egg is used as a phantom.

In the exemplary embodiment, since the flip angles α of the RF pulses X1 to X16 are respectively set to a sufficiently small value (α=5° in the exemplary embodiment), it is possible to sufficiently reduce each side lobe generated in the z-spectrum. Thus, since a plurality of low signal peaks (refer to FIG. 20) seen in the z-spectrum in the conventional method become hard to appear in the z-spectrum obtained by the method of the exemplary embodiment, it is possible to easily correct the shift $\Delta f$ in the center frequency.

After the correction of the shift in the center frequency, the flow proceeds to Step ST5.

In Step ST5, a CEST image is generated. A method of generating the CEST image will be described below with reference to FIGS. 15A-15E.

The CEST image generator 83 (refer to FIG. 1) first inverts signal values of 0 ppm to −7 ppm of the post-correction z-spectrum w' to the positive frequency side of the z-spectrum w' centering on 0 ppm. FIG. 15A shows a z-spectrum w' prior to the inversion of the signal values of 0 ppm to −7 ppm, and FIG. 15B shows a z-spectrum w' after the inversion of the signal values of 0 ppm to −7 ppm to the positive frequency side. In FIG. 15B, data V1 indicative of the pre-inversion signal values of 0 ppm to −7 ppm is indicated by a broken line, and data V2 obtained by inverting the signal values of 0 ppm to −7 ppm is indicated by a solid line, respectively. After the inversion of the signal values, the CEST image generator 83 calculates the difference between the data V2 obtained by inversion and data V3 indicative of signal values of 7 ppm to 0 ppm. Difference data DIF indicative of the difference between the data V2 and the data V3 is shown in FIG. 15C. The difference data DIF indicates the amount of a reduction in signal generated by the CEST effect. After the difference data DIF has been determined, the CEST image generator 83 determines a feature amount r of the difference data DIF. One example of the feature amount r of the difference data DIF is shown in FIG. 15D. For example, a signal value v at 3.5 ppm of the difference data DIF or the area S of the difference data DIF can be taken as the feature amount r. The thus-obtained feature amount r of difference data DIF is used as a pixel value r at a pixel g1 of the CEST image. The CEST image is schematically illustrated in FIG. 15E.

While the example of determining the pixel value of the pixel g1 in the CEST image is shown in each of FIGS. 12 through 15E, the pixel values of other pixels in the CEST image can also be determined in accordance with the procedure illustrated in FIGS. 12 through 15E.

After the generation of the CEST image, the flow is completed.

In the exemplary embodiment, the pulse sequence is executed while cycling the phases of the plural RF pulses. It is thus possible to use the RF pulse of the rectangular wave (or shape near the rectangular wave) instead of the RF pulse (RF pulse having the shape like the Gaussian distribution or Blackman filter) used in the conventional method. Since the time interval T_iter between the RF pulses can be shortened by using the RF pulse of the rectangular wave (or shape near the rectangular wave), the flip angle per unit time can be made large even if the flip angle of one RF pulse is small. Thus, the CEST effect can sufficiently be detected even though the flip angle of each individual RF pulse is small.

Incidentally, in Step ST3 of the above flow, q contained in Equation 5 is set to q=4. A description will be made below about the reason why q is set to 4.

FIGS. 16A-16D are diagrams for describing the reason why q is set to q=4.

In FIGS. 16A-16D, in order to facilitate understanding, q will be explained divided into four of q=1.2, q=2, q=4 and q=8 for convenience.

Figure 16A:
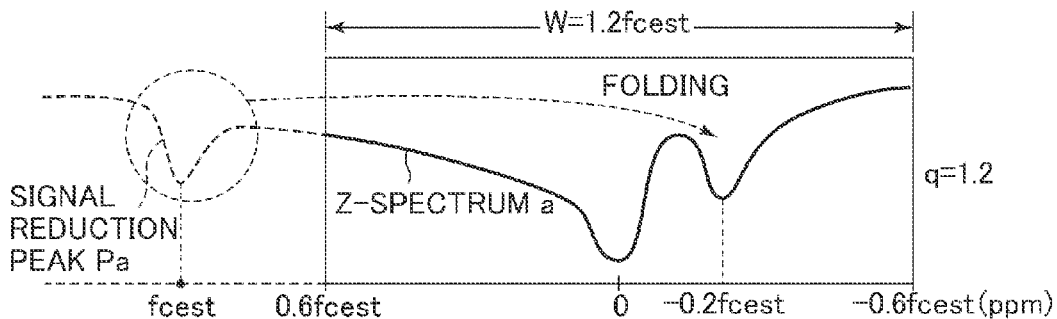
FIGS. 16A-16D are diagrams for describing the reason why q is set to q=4.

FIG. 16A is a diagram schematically showing a z-spectrum where q=1.2.

When q=1.2, Equation 5 is represented by the following equation:

$$T\_iter = \frac{1}{(1.5T \times 42.58 \text{ MHz}/T)} * \frac{1}{fcest \times 1.2 * 10^{-3}} \quad \text{Equation 9}$$

It is understood from Equation 9 that the time interval T_iter is equivalent to a frequency equal to 1.2 times fcest. Thus, a z-spectrum a having a frequency bandwidth W=1.2fcest (frequency range: 0.6fcest to −0.6fcest) is obtained by applying RF pulses at the time interval T_iter of Equation 9. In the z-spectrum a, however, a signal at the frequency fcest is located outside the frequency range (0.6fcest to −0.6fcest). Thus, a signal reduction peak Pa that is to originally appear in the frequency fcest appears in a position (i.e., position of −0.2fcest) shifted by 1.2fcest from the position of the frequency fcest by folding. Therefore, a problem arises in that when q=1.2, the position of the frequency at which the CEST effect appears cannot be identified correctly.

Next consider where q=2.

Figure 16B:
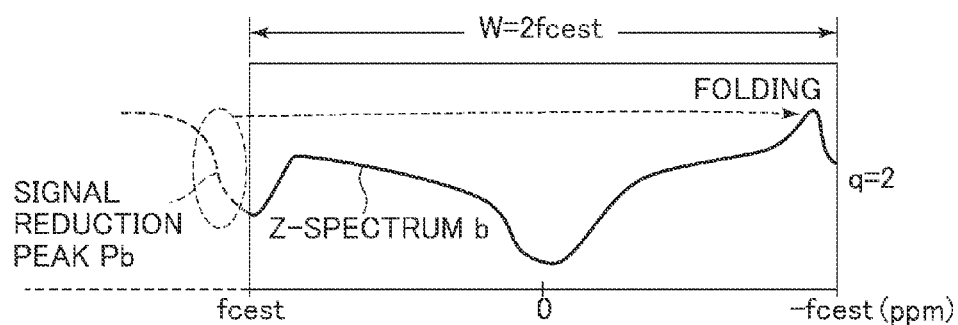

FIG. 16B is a diagram schematically showing a z-spectrum where q=2.

When q=2, Equation 5 is represented by the following equation:

$$T\_iter = \frac{1}{(1.5T \times 42.58 \text{ MHz}/T)} * \frac{1}{fcest \times 2 * 10^{-3}} \quad \text{Equation 10}$$

It is understood from Equation 10 that the time interval T_iter is equivalent to a frequency equal to twice fcest. Thus, a z-spectrum b having a frequency bandwidth W=2fcest (frequency range: fcest to −fcest) is obtained by applying RF pulses at the time interval T_iter of the equation (10). Incidentally, in FIG. 16B, a signal reduction peak Pb that is to appear in the frequency fcest appears in a position (i.e., position of −fcest) shifted by 2fcest from the position of the frequency fcest by folding. Since, however, the signal reduction peak Pb has a predetermined half-value width, only a signal component that appears on the high frequency side rather than the frequency fcest, of the signal reduction peak Pb appears in the position of the frequency −fcest by folding. Of the signal reduction peak Pb, a signal component that appears on the low frequency side rather than the frequency fcest remains as a peak appearing in the frequency fcest without being affected by folding.

Thus, since the peak appears in the frequency fcest where q=2, it is possible to recognize the position of the frequency at which the CEST effect appears. A problem, however, arises in that since part of the peak Pb appearing in the frequency fcest appears in the position of the frequency −fcest under the influence of folding, the signal component of the peak of the CEST effect appears in the position of the frequency −fcest at which the CEST effect does not occur originally. Therefore, in the exemplary embodiment, q is set to q=4. Consider below where q=4.

Figure 16C:
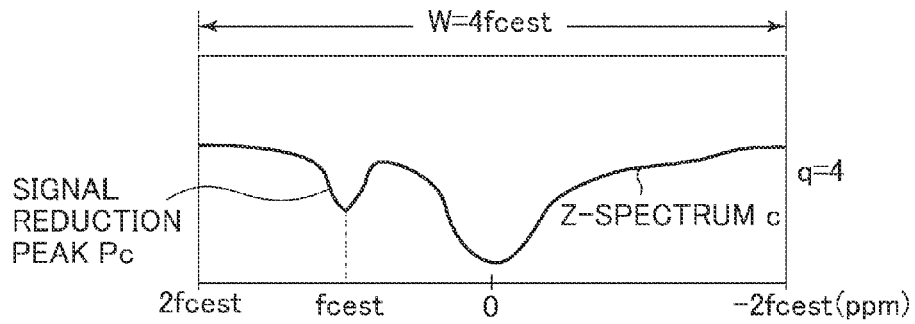

FIG. 16C is a diagram schematically showing a z-spectrum where q=4.

When q=4, Equation 5 is represented by Equation 6. It is understood from Equation 6 that the time interval T_iter is equivalent to a frequency equal to four times fcest. Thus, a z-spectrum c having a frequency bandwidth W=fcest (frequency range: 2fcest to −2fcest) is obtained by applying RF pulses at the time interval Titer of Equation 6. Since the frequency fcest is contained in the frequency range 2fcest to −2fcest of the z-spectrum c in FIG. 16C, a signal reduction peak Pc that appears in the frequency fcest remains in the position of the original frequency fcest without being affected by folding. It is therefore possible to correctly recognize the position of the frequency at which the CEST effect appears.

For such a reason, q is set to q=4 in the present embodiment. Incidentally, in the systems and methods described herein, q is not limited to q=4, but may be smaller than 4 if it is possible to sufficiently reduce the influence of folding. However, setting q to be too smaller than 4 causes such a problem as described in each of FIGS. 16A and 16B. Thus, q is desirably set to 4 or a value close to 4.

Figure 16D:
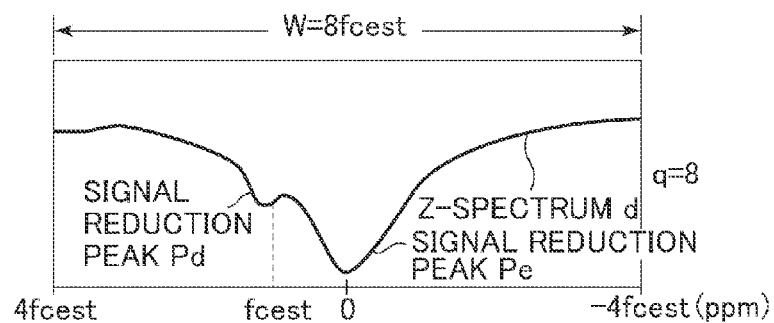

Although the above description has shown where q=4, q may be set to q>4. A z-spectrum d where q=8 is shown in FIG. 16D. Since the frequency fcest is contained in a frequency range 4fcest to −4fcest of the z-spectrum d in FIG. 16D, a signal reduction peak Pd that appears in the frequency fcest remains in the position of the original frequency fcest without being affected by folding. Thus, even if q=8, it is possible to correctly recognize the position of the frequency at which the CEST effect appears, as with the case where q=4.

If, however, q is set to q=8, the frequency range of the z-spectrum expands twice as compared with q=4. Thus, when q=8, the position of the frequency fcest becomes closer to the position of the center frequency than when q=4. Therefore, when the half-value width of the signal reduction peak Pd that appears in the frequency fcest is wide, it is overlaid on a signal reduction peak Pe that appears in the center frequency, so that it may become hard to look at or detect the CEST effect.

Thus, when the z-spectra shown in FIGS. 16A-16D are compared with each other, it is understood that q=4 (or value close to q=4) may be taken to obtain information of the CEST effect high in reliability. For such a reason, q is set to q=4.

When q=4, the time interval T_iter is 1.118 ms. Thus, when the time required to apply one RF pulse becomes long, it is not possible to apply each RF pulse at the interval of 1.118 ms. Therefore, in the exemplary embodiment, the RF pulse of the rectangular wave (or shape near the rectangular wave) is used. Each RF pulse can be applied at the interval of 1.118 ms by using the RF pulse of the rectangular wave (or shape near the rectangular wave). Since the time interval T_iter between the RF pulses can be shortened, it is possible to increase a flip angle per unit time even if the flip angle of one RF pulse is small. Thus, even if the flip angle of each individual RF pulse is small, the CEST effect can be enlarged.

Incidentally, in the exemplary embodiment, the pulse set having the n RF pulses is executed m times (refer to FIG. 3). The number of times m the pulse set is executed may be once or two or more times. Further, after execution of the mth pulse set Setm, one to n−1 RF pulses may be applied before the killer gradient pulse is applied.

Also, the pulse sets used in each of the above pulse sequences are configured in such a manner that the positive and negative RF pulses alternately appear. However, the pulse sets may be configured using only the positive RF pulses. Alternatively, the pulse sets may be configured using only the negative RF pulses.

Figure 17:
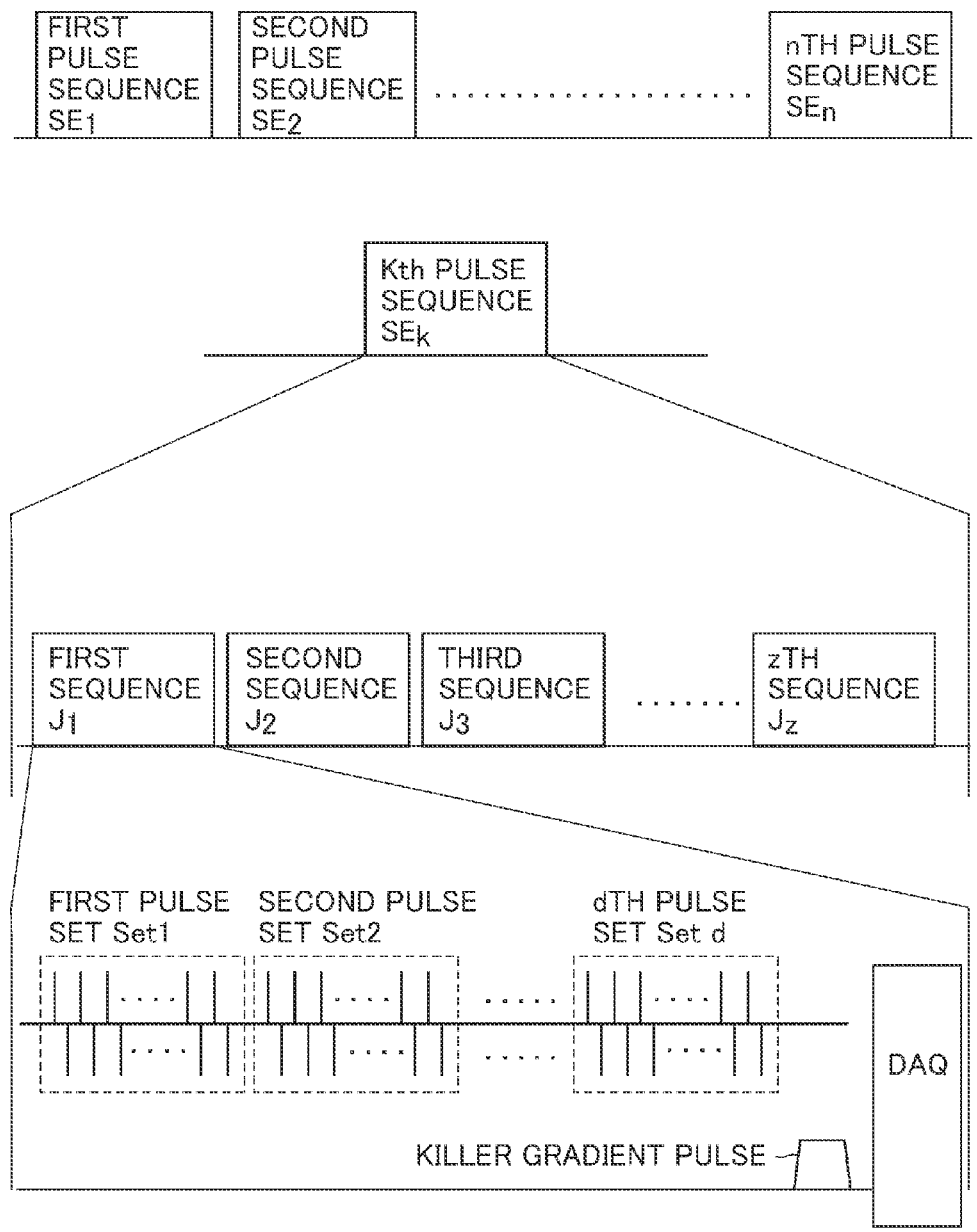
FIG. 17 is a diagram illustrating an example for acquiring data by a multi-shot method.
Figure 18:
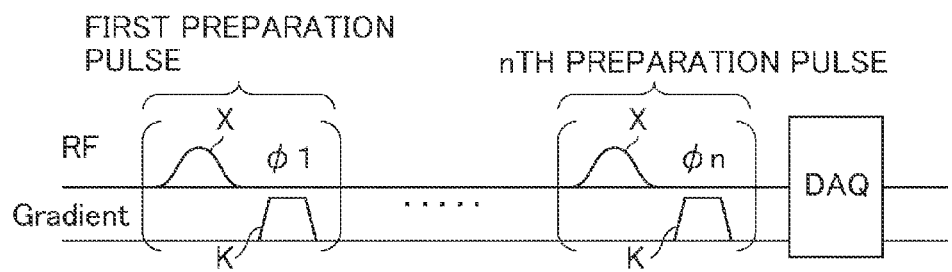
FIG. 18 is a diagram showing an example of a sequence used in a CEST method.
Figure 19:
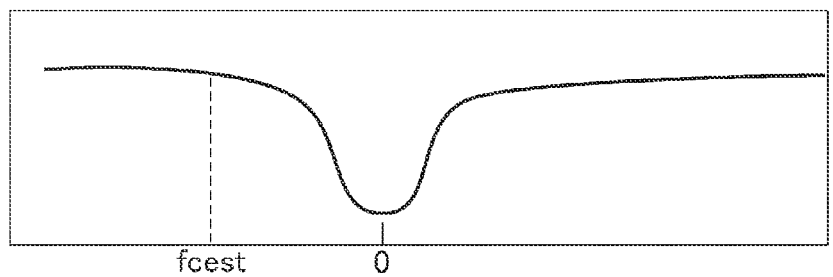
FIG. 19 is a diagram schematically showing an example of a z-spectrum obtained when the white of a raw egg is used as a phantom.

Further, the data acquisition sequence DAQ used in each of the above pulse sequences is taken to acquire the data by the single shot method. The data acquisition sequence DAQ is however not limited to or by the single shot method, but can use another acquiring method. For example, data may be acquired by a multi-shot method. FIG. 17 shows an example of a pulse sequence used when acquiring data by the multi-shot method.

FIG. 17 is a diagram showing the example of acquiring the data by the multi-shot method.

A kth pulse sequence $SE_k$ has first to zth pulse sequences J1 to Jz.

In the first pulse sequence J1, first to dth pulse sets Set1 to Setd are executed. After the application of a killer gradient pulse, a data acquisition sequence DAQ for acquiring data in a partial region of a k-space is executed.

Even in each of the second to zth pulse sequences J2 to Jz, the first to dth pulse sets Set1 to Setd are executed as with the first pulse sequence J1. After a killer gradient pulse is applied, a data acquisition sequence DAQ is executed.

In the multi-shot method, the first to zth pulse sequences J1 to Jz are executed to thereby acquire data in a k-space necessary for image reconstruction. Thus, in the systems and methods described herein, various methods can be used as the method of acquiring the data in the k-space.

Incidentally, the exemplary embodiment has described the example of acquiring the data by the single slice method. The systems and methods described herein can however be applied even to the case of acquiring data by a multi-slice method. In the case of acquiring the data by the multi-slice method, data of z slices can be acquired by using the first to zth sequences J1 to Jz shown in FIG. 17.

What is claimed is:

1. A magnetic resonance apparatus comprising:
   a scanner configured to execute a plurality of pulse sequences, each pulse sequence of the plurality of pulse sequences including a plurality of RF pulses for generating magnetization transfer of protons and a data acquisition sequence for acquiring data from a region in which proton magnetization transfer occurs, wherein the phases of the plurality of RF pulses are cycled so as to make a phase difference between the phase of a pth RF pulse of the plurality of RF pulses and the phase of a p+1th RF pulse of the plurality of RF pulses different for each pulse sequence; and
   a controller configured to control operations that include processing for determining a spectrum indicative of a relationship between a signal intensity of each signal obtained from the region and the associated phase differences based on data obtained by executing the plurality of pulse sequences.

2. The magnetic resonance apparatus according to claim 1, wherein a time interval between the plurality of RF pulses is set based on a resonant frequency of a proton at which magnetization transfer occurs.

3. The magnetic resonance apparatus according to claim 2, wherein a time interval between the plurality of RF pulses is set based on a frequency equal to four times the resonant frequency of the proton at which magnetization transfer occurs.

4. The magnetic resonance apparatus according to claim 1, wherein the operations include:
   generating a plurality of images of the region for each pulse sequence based on the data obtained by executing the plurality of pulse sequences; and
   generating the spectrum based on the plurality of images.

5. The magnetic resonance apparatus according to claim 4, wherein the operations include converting the phase difference of the spectrum into a frequency.

6. The magnetic resonance apparatus according to claim 4, wherein the operations include correcting a center frequency of the spectrum.

7. The magnetic resonance apparatus according to claim 6, wherein the operations include generating a CEST image based on the spectrum of which the center frequency is corrected.

8. The magnetic resonance apparatus according to claim 1, wherein a difference in phase between the plurality of RF pulses in the kth pulse sequence is set by the following equation:

$$\Delta\phi(k) = \frac{2*(k-1)}{n}$$

where $\Delta\phi(k)$ is the phase difference, and
n is the number of times the pulse sequence is executed.

9. The magnetic resonance apparatus according to claim 8, wherein each pulse sequence of the plurality of pulse sequences has one or more pulse sets including the plurality of RF pulses.

10. The magnetic resonance apparatus according to claim 1, wherein the scanner is configured to execute the data acquisition sequence such that data is acquired by a single-shot method or a multi-shot method.

11. The magnetic resonance apparatus according to claim 1, wherein the scanner is configured to execute the data acquisition sequence such that data is acquired by a single-slice method or a multi-slice method.

12. A method for detecting a phenomenon of magnetization transfer of protons based on CEST method using a magnetic resonance apparatus, the method comprising:
obtaining data by executing a plurality of pulse sequences, each pulse sequence of the plurality of pulse sequences including a plurality of RF pulses for generating magnetization transfer of protons and a data acquisition sequence for acquiring data from a region in which proton magnetization transfer occurs, wherein the phases of the plurality of RF pulses are cycled so as to make a phase difference between the phase of a pth RF pulse of the plurality of RF pulses and the phase of a p+1th RF pulse of the plurality of RF pulses different for each pulse sequence; and
determining a spectrum indicative of a relationship between a signal intensity of each signal obtained from the region and the associated phase differences based on the data obtained by executing the plurality of pulse sequences.

13. The method for detecting a phenomenon of magnetization transfer of protons according to claim 12, wherein a time interval between the plurality of RF pulses is set based on a resonant frequency of a proton at which magnetization transfer occurs.

14. The method for detecting a phenomenon of magnetization transfer of protons according to claim 13, wherein a time interval between the plurality of RF pulses is set based on a frequency equal to four times the resonant frequency of the proton at which magnetization transfer occurs.

15. The method for detecting a phenomenon of magnetization transfer of protons according to claim 12, wherein determining a spectrum comprises:
generating a plurality of images of the region for each pulse sequence based on the data obtained by executing the plurality of pulse sequences; and
generating the spectrum, based on the plurality of images generated.

16. The method for detecting a phenomenon of magnetization transfer of protons according to claim 15, wherein generating the spectrum comprises converting the phase difference of the spectrum into a frequency.

17. The method for detecting a phenomenon of magnetization transfer of protons according to claim 15, wherein generating the spectrum comprises correcting a center frequency of the spectrum.

18. The method for detecting a phenomenon of magnetization transfer of protons according to claim 17, further comprising:
generating a CEST image based on the spectrum of which the center frequency is corrected.

19. The method for detecting a phenomenon of magnetization transfer of protons according to claim 12, wherein a difference in phase between the plurality of RF pulses in the kth pulse sequence is set by the following equation:

$$\Delta\phi(k) = \frac{2\pi * (k-1)}{n}$$

where $\Delta\phi(k)$ is the phase difference, and
n is the number of times the pulse sequence is executed.

20. The method for detecting a phenomenon of magnetization transfer of protons according to claim 19, wherein each pulse sequence of the plurality of pulse sequences has one or more pulse sets including the plurality of RF pulses.

* * * * *